(12) United States Patent
Kim

(10) Patent No.: US 11,894,403 B2
(45) Date of Patent: Feb. 6, 2024

(54) SEMICONDUCTOR PACKAGE AND METHOD FOR FABRICATING SAME

(71) Applicant: SAMSUNG ELECTRONICS CO., LTD., Suwon-si (KR)

(72) Inventor: Dong Kwan Kim, Hwaseong-si (KR)

(73) Assignee: Samsung Electronics Co., Ltd.

( * ) Notice: Subject to any disclaimer, the term of this patent is extended or adjusted under 35 U.S.C. 154(b) by 276 days.

(21) Appl. No.: 17/239,650

(22) Filed: Apr. 25, 2021

(65) Prior Publication Data

US 2022/0085086 A1 Mar. 17, 2022

(30) Foreign Application Priority Data

Sep. 17, 2020 (KR) .................. 10-2020-0119577

(51) Int. Cl.
*H01L 27/146* (2006.01)
*C08K 3/36* (2006.01)
*C08K 3/22* (2006.01)

(52) U.S. Cl.
CPC .......... *H01L 27/14618* (2013.01); *C08K 3/22* (2013.01); *C08K 3/36* (2013.01); *H01L 27/1463* (2013.01); *H01L 27/1464* (2013.01); *H01L 27/14627* (2013.01); *H01L 27/14636* (2013.01);
(Continued)

(58) Field of Classification Search
CPC ......... H01L 27/14618; H01L 27/14627; H01L 27/1463; H01L 27/14636; H01L 27/1464; H01L 27/14683; H01L 2224/16225; H01L 2224/32225; H01L 2224/48227; H01L 2224/49171; H01L 2224/73265; H01L 2224/97; H01L 2924/15311; H01L 2924/181; H01L 23/3135; H01L 23/13; H01L 23/293; H01L 24/46; H01L 24/49;
(Continued)

(56) References Cited

U.S. PATENT DOCUMENTS 6,303,978 B1 * 10/2001 Daniels ............... H01L 23/3107
257/792
7,402,906 B2 7/2008 Rahman Khan et al.
8,928,803 B2 1/2015 Shimizu
(Continued)

FOREIGN PATENT DOCUMENTS

| CN | 109755263 A | 5/2019 |
|---|---|---|
| JP | 2020021904 A | 2/2020 |
| KR | 20170051972 A | 5/2017 |

*Primary Examiner* — Jonathan Han
(74) *Attorney, Agent, or Firm* — Fish & Richardson P.C.

(57) ABSTRACT

A semiconductor package including a semiconductor chip on a package substrate, a transparent substrate on the semiconductor chip, an attachment dam between the semiconductor chip and the transparent substrate, the attachment dam extending along an edge of the semiconductor chip, a first molding layer on the package substrate and surrounding a side surface of the semiconductor chip and including a first epoxy resin, and a second molding layer on the package substrate and filling a space between the semiconductor chip and the first molding layer and including a second epoxy resin. The first epoxy resin includes a first filler containing at least one of silica or alumina. The second epoxy resin includes a second filler containing at least one of silica or alumina. The content of the second filler in the second epoxy resin is greater than a content of the first filler in the first epoxy resin.

19 Claims, 11 Drawing Sheets

(52) U.S. Cl.
CPC ............... *H01L 27/14683* (2013.01); *C08K 2003/2227* (2013.01)

(58) Field of Classification Search
CPC ... H01L 25/105; H01L 27/14634; C08K 3/22; C08K 3/36; C08K 2003/2227
See application file for complete search history.

(56) References Cited

U.S. PATENT DOCUMENTS

| | | | |
|---|---|---|---|
| 10,008,533 | B2 | 6/2018 | Jun |
| 10,091,887 | B2 | 10/2018 | Heikkinen et al. |
| 10,340,250 | B2 | 7/2019 | Chen et al. |
| 2011/0024862 | A1* | 2/2011 | Tu .................... H01L 27/14618 257/434 |
| 2011/0089549 | A1* | 4/2011 | Zenbutsu ............ H01L 23/3128 257/E23.116 |
| 2017/0154913 | A1* | 6/2017 | Jun ........................ H01L 24/97 |
| 2017/0162742 | A1 | 6/2017 | Prajuckamol et al. |
| 2017/0226378 | A1* | 8/2017 | Hikita ..................... H01L 33/62 |
| 2017/0345864 | A1* | 11/2017 | Kinsman ........... H01L 27/14618 |
| 2017/0345982 | A1* | 11/2017 | Abe ...................... H01L 33/502 |
| 2018/0019274 | A1* | 1/2018 | Yang ................. H01L 27/14618 |
| 2018/0145232 | A1* | 5/2018 | Hashimoto ............. H01L 33/62 |
| 2019/0057952 | A1* | 2/2019 | Chen ....................... H01L 24/29 |
| 2019/0139843 | A1 | 5/2019 | Shigeta et al. |
| 2020/0144318 | A1 | 5/2020 | Hsieh |

\* cited by examiner

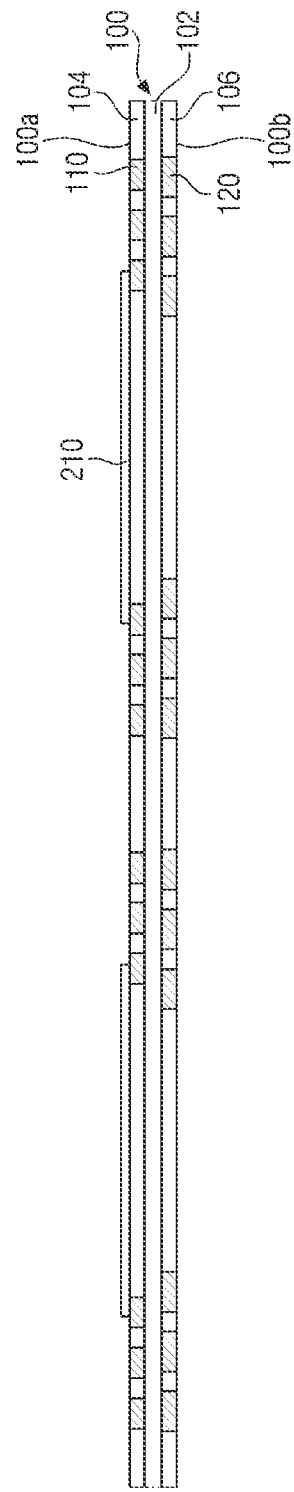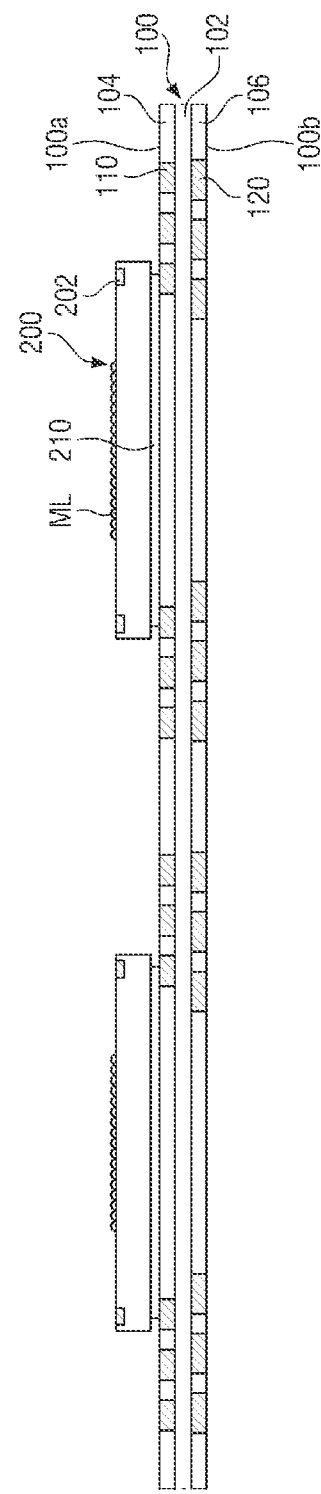

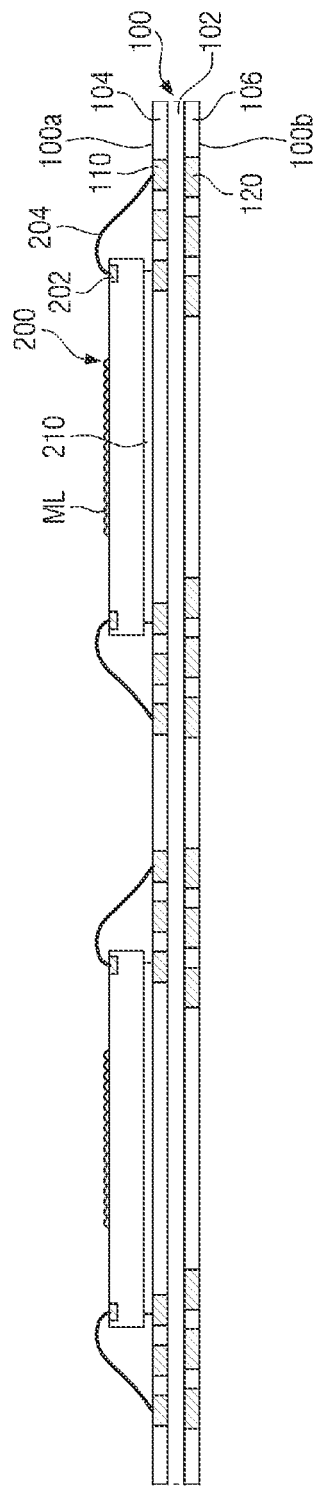
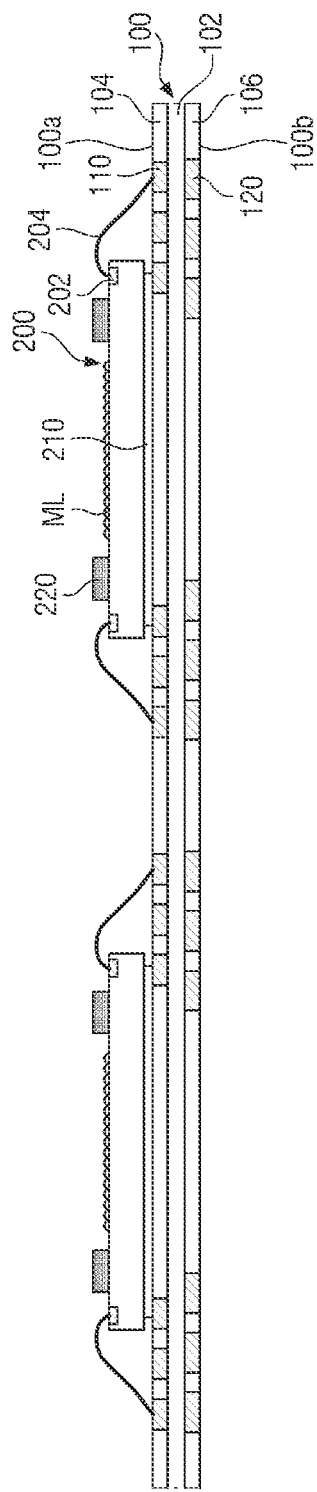

SEMICONDUCTOR PACKAGE AND METHOD FOR FABRICATING SAME

CROSS-REFERENCE TO RELATED APPLICATION

This application claims priority under 35 U.S.C. 119 from Korean Patent Application No. 10-2020-0119577 filed on Sep. 17, 2020 in the Korean Intellectual Property Office, the subject matter of which is hereby incorporated by reference.

BACKGROUND

1. Technical Field

The inventive concept relates generally to semiconductor packages and methods of fabricating same. More particularly, the inventive concept relates to semiconductor packages including a molding layer and methods of fabricating same.

2. Description of the Related Art

Image sensors, such as a charge coupled device (CCD) image sensor or a complementary metal oxide semiconductor (CMOS) image sensor, have been applied to various electronic products including mobile phones, digital cameras, optical mice, surveillance cameras, and biometric devices. Further, as electronic products have gradually miniaturized and become multifunctional, demands for greater integration density, lower power consumption, higher speed signal processing, improved reliability and better productivity have been placed upon semiconductor packages including image sensors.

SUMMARY

Embodiments of the inventive concept provide semiconductor packages having improved reliability, as well as methods of fabricating same.

According to one aspect of the inventive concept, there is provided a semiconductor package comprising: a package substrate, a semiconductor chip mounted on the package substrate, a transparent substrate disposed on the semiconductor chip, an attachment dam between the semiconductor chip and the transparent substrate, the attachment dam extending along an edge of the semiconductor chip to define a gap between the semiconductor chip and the transparent substrate, a first molding layer on the package substrate, the first molding layer surrounding a side surface of the semiconductor chip and including a first epoxy resin composition, and a second molding layer on the package substrate, the second molding layer filling a space between the semiconductor chip and the first molding layer and including a second epoxy resin composition, wherein the first epoxy resin composition includes a first filler containing at least one of silica or alumina, the second epoxy resin composition includes a second filler containing at least one of silica or alumina, and a content of the second filler with respect to the second epoxy resin composition is greater than a content of the first filler with respect to the first epoxy resin composition.

According to one aspect of the inventive concept, there is provided a semiconductor package comprising: a first package substrate including a first surface and a second surface opposite to each other, an image sensor chip mounted on the first surface of the first package substrate, a transparent substrate disposed on the image sensor chip, an attachment dam between the image sensor chip and the transparent substrate, the attachment dam extending along an edge of the image sensor chip to define a gap between the image sensor chip and the transparent substrate, a first molding layer on the first surface of the first package substrate, the first molding layer being spaced apart from the image sensor chip and surrounding a side surface of the image sensor chip, and a second molding layer on the first surface of the first package substrate, the second molding layer filling a space between the image sensor chip and the first molding layer, wherein a side surface of the first molding layer facing the second molding layer forms an acute angle with the first surface of the first package substrate.

According to one aspect of the inventive concept, there is provided a semiconductor package comprising: a package substrate, a semiconductor chip mounted on the package substrate, a transparent substrate disposed on the semiconductor chip, an attachment dam between the semiconductor chip and the transparent substrate, the attachment dam extending along an edge of the semiconductor chip to define a gap between the semiconductor chip and the transparent substrate, a first molding layer on the package substrate, the first molding layer surrounding a side surface of the semiconductor chip, and a second molding layer on the package substrate, the second molding layer filling a space between the semiconductor chip and the first molding layer, wherein a coefficient of thermal expansion (CTE) of the second molding layer is smaller than that of the first molding layer.

BRIEF DESCRIPTION OF THE DRAWINGS

The above and other aspects and features of the inventive concept may be clearly understood by those skilled in the art upon consideration of the following detail description together with the accompanying drawings, in which:

FIGS. 10, 11, 12, 13, 14, 15, 16, 17 and 18 (hereafter collectively, "FIGS. 10 to 18") are related cross-sectional diagram illustrating in one example a method of fabricating a semiconductor package according to embodiments of the inventive concept.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below;

under/over; upper/lower; center/side; surrounding; overlay/underlay; etc.

Figure 1:
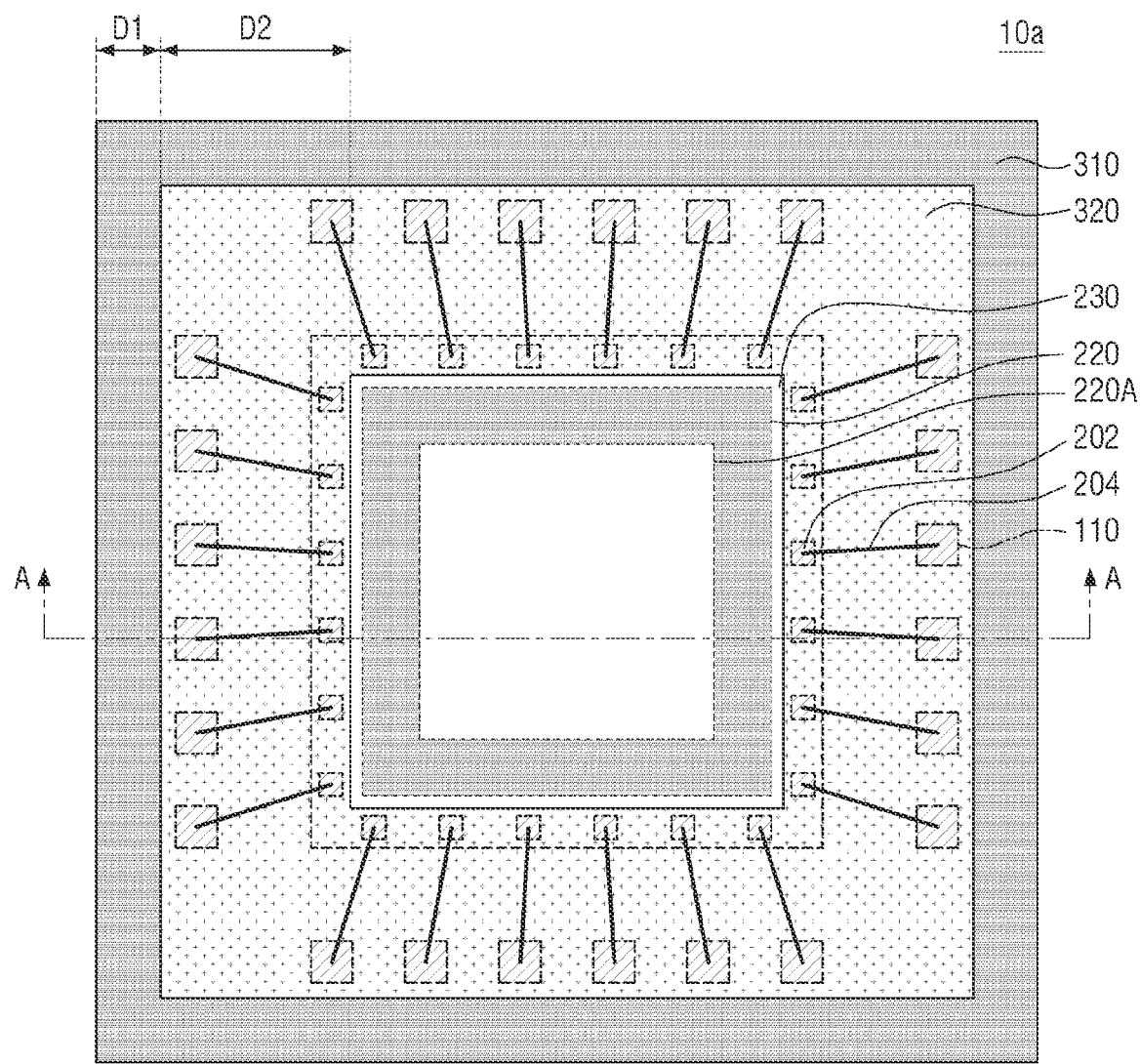
FIG. 1 is a plan (or top-down) diagram illustrating a semiconductor package according to embodiments of the inventive concept.
Figure 2:
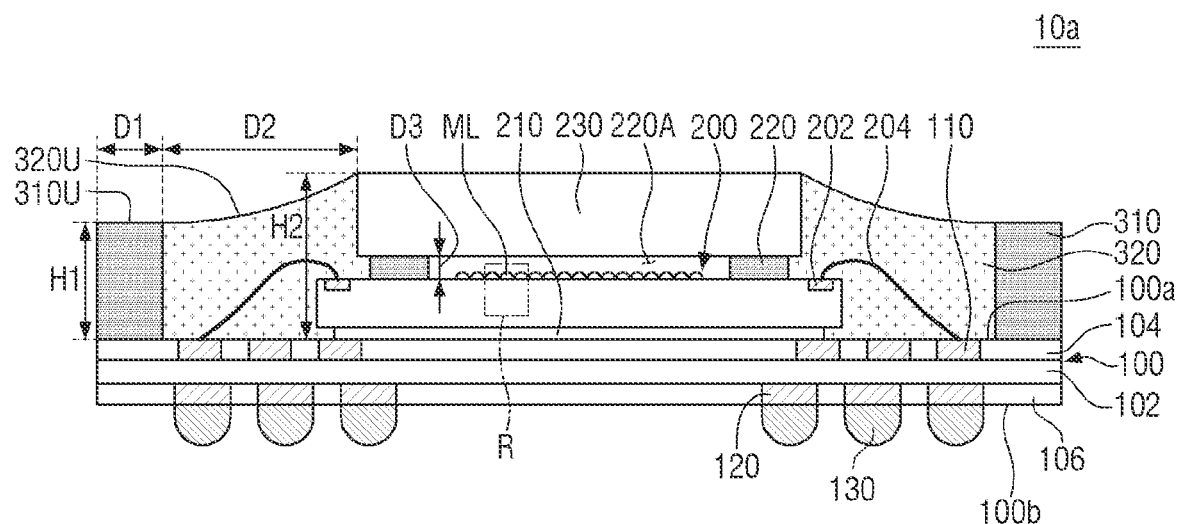
FIG. 2 is a cross-sectional diagram taken along line A-A of FIG. 1.

Figure (FIG. 1 is a plan (or top-down) diagram illustrating a semiconductor package 10a according to embodiments of the inventive concept; FIG. 2 is a cross-sectional diagram taken along line A-A of FIG. 1; and FIG. 3 is an enlarged view of area 'R' identified in FIG. 2.

Figure 3:
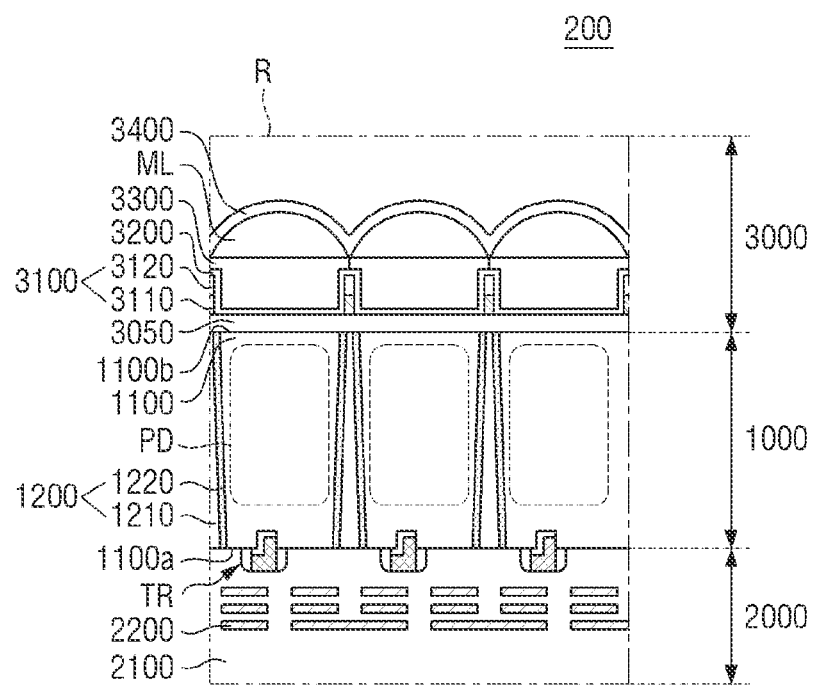
FIG. 3 is an enlarged view of area 'R' identified in FIG. 2.

Referring to FIGS. 1, 2 and 3, the semiconductor package 10a includes a first package substrate 100, a first connection terminal 130, a first semiconductor chip 200, a transparent substrate 230, an attachment dam 220, a first molding layer 310 and a second molding layer 320.

The first package substrate 100 may be a substrate for a semiconductor package. As an example, the first package substrate 100 may be a printed circuit board (PCB). Alternatively, the first package substrate 100 may be a ceramic substrate, a wafer level package (WLP) substrate, or a package level package (PLP) substrate.

The first package substrate 100 may include a first surface 100a and an opposing second surface 100b. In some embodiments, the first package substrate 100 may include a first wiring layer 102, a first substrate pad 110, and a second substrate pad 120.

The first substrate pad 110 may be disposed on the top surface of the first wiring layer 102. The first substrate pad 110 may be exposed from the top surface of the first package substrate 100. For example, the first substrate pad 110 may be selectively exposed through a first passivation layer 104 covering the top surface of the first wiring layer 102. The first passivation layer 104 may be a solder resist layer, but is not limited thereto.

The second substrate pad 120 may be disposed on the bottom surface of the first wiring layer 102. The second substrate pad 120 may be selectively exposed through the bottom surface of the first package substrate 100. For example, the second substrate pad 120 may be selectively exposed through a second passivation layer 106 covering the bottom surface of the first wiring layer 102. The second passivation layer 106 may be a solder resist layer, but is not limited thereto.

The first wiring layer 102 may include insulating layers made of plastic, ceramic or the like, as well as conductive vias and conductive wirings variously disposed in (or through) the insulating layers. The first substrate pad 110 may be electrically connected to the second substrate pad 120 using the conductive vias and the conductive wirings of the first wiring layer 102.

The first wiring layer 102 may include, for example, at least one of phenol resin, epoxy resin, or polyimide, but is not limited thereto. For example, the first wiring layer 102 may include at least one of; Flame Retardant 4 (FR4), tetrafunctional epoxy, polyphenylene ether, epoxy/polyphenylene oxide, bismaleimide triazine (BT), Thermount, cyanate ester, polyimide, a liquid crystal polymer, etc.

The first substrate pad 110 and the second substrate pad 120 may each include at least one conductive material, such as copper (Cu), beryllium copper, nickel (Ni), or stainless steel, but are not limited thereto.

In some embodiments, the first package substrate 100 may include a copper clad laminate (CCL). For example, the first package substrate 100 may have a structure in which a copper laminate is stacked on one or both surfaces of a cured prepreg (e.g., C-Stage prepreg). As an example, the first and second substrate pads 110 and 120 may be portions exposed through the first and second passivation layers 104 and 106, among circuit wirings patterned after coating copper laminates on the surfaces of the first wiring layer 102.

The first connection terminal 130 may be disposed on the second surface 100b of the first package substrate 100. The first connection terminal 130 may be electrically connected to the first package substrate 100. For example, the first connection terminal 130 may be attached to the second substrate pad 120 of the first package substrate 100. The first connection terminal 130 may be, for example, a solder ball, a bump, or the like. In some embodiments, the first package substrate 100 may be a substrate configured to support a ball grid array (BGA). The first connection terminal 130 may include metal such as tin (Sn), but is not limited thereto. Here, the first connection terminal 130 may be used to electrically connect the semiconductor package 10a to an external electronic device or circuit.

The first semiconductor chip 200 may be mounted on the first surface 100a of the first package substrate 100 using one of a number of conventionally understood techniques. For example, an attachment film 210 may be formed on the first surface 100a of the first package substrate 100, wherein the attachment film 210 may include, for example, a liquid epoxy, an adhesive tape, or a conductive medium, but is not limited thereto. The first semiconductor chip 200 may be attached to the attachment film 210 in order to be fixed on the first surface 100a of the first package substrate 100.

The first semiconductor chip 200 may be electrically connected to the first package substrate 100. In some embodiments, a bonding wire 204 may be used to variously connect the first semiconductor chip 200 to the first package substrate 100. As an example, the first semiconductor chip 200 may include a first chip pad 202 exposed at the top surface of the first semiconductor chip 200. The bonding wire 204 may connect the first chip pad 202 of the first semiconductor chip 200 to the first substrate pad 110 of the first package substrate 100. The bonding wire 204 may include, for example, a conductive material such as gold (Au), but is not limited thereto.

Although FIGS. 1, 2 and 3 show the first semiconductor chip 200 electrically connected to the first package substrate 100 via the bonding wire 204, this is only an illustrative example. Alternately, for example, the first semiconductor chip 200 may be electrically connected to the first package substrate 100 via a bonding tape, or a flip chip bonding method.

In some embodiments, the first semiconductor chip 200 may be an image sensor chip. As shown in FIG. 3, for example, the first semiconductor chip 200 may include a photoelectric conversion portion 1000, a wiring structure portion 2000, and a light transmitting portion 3000.

The photoelectric conversion portion 1000 may include a semiconductor substrate 1100, a pixel isolation pattern 1200, and a photoelectric conversion layer PD.

The semiconductor substrate 1100 may be, for example, a bulk silicon or silicon-on-insulator (SOI) substrate. The semiconductor substrate 1100 may be a silicon substrate, or may include other materials such as silicon germanium, indium antimonide, lead tellurium compound, indium arsenide, indium phosphide, gallium arsenide, or gallium antimonide. Alternatively, the semiconductor substrate 1100 may have an epitaxial layer formed on a base substrate.

The semiconductor substrate 1100 may include a front side 1100*a* and an opposing back side 1100*b*. In some embodiments, the back side 1100*b* of the semiconductor substrate 1100 may be used as a light receiving surface receiving incident electromagnetic energy of defined wavelength (e.g., visible light). That is, the first semiconductor chip 200 may be a backside illumination (BSI) image sensor chip.

In some embodiments, transistors TR may be disposed on the front side 1100*a* of the semiconductor substrate 1100. The transistors TR may include at least one of various transistors, such as a transfer transistor, a reset transistor, a source follower transistor, a selection transistor, etc. These transistors TR may constitute a unit pixel of an image sensor.

The pixel isolation pattern 1200 may define a plurality of unit pixels in the semiconductor substrate 1100. The unit pixels may be arranged two-dimensionally (e.g., in a matrix when viewed in plan (or top-down). For example, the pixel isolation pattern 1200 may be formed in a grid shape, wherein unit pixels are separate from one another. The pixel isolation pattern 1200 may be formed, for example, by filling an insulating material in deep trenches formed by patterning the semiconductor substrate 1100.

In some embodiments, the pixel isolation pattern 1200 may include a conductive filling pattern 1210 and an insulating spacer layer 1220. The insulating spacer layer 1220 may conformally extend along the side surface of the trench in the semiconductor substrate 1100. The conductive filling pattern 1210 may be formed on the insulating spacer layer 1220 to at least partially fill the trench in the semiconductor substrate 1100.

Each of the unit pixels may include the photoelectric conversion layer PD. The photoelectric conversion layer PD may be formed in the semiconductor substrate 1100. The photoelectric conversion layer PD may generate electric charges in proportion to an amount of light incident from the outside. The photoelectric conversion layer PD may be formed by doping impurities into the semiconductor substrate 1100. For example, the photoelectric conversion layer PD may be formed by ion-implanting N-type impurities into the P-type semiconductor substrate 1100.

The wiring structure portion 2000 may be disposed on the front side 1100*a* of the semiconductor substrate 1100. The wiring structure portion 2000 may cover the transistors TR. The wiring structure portion 2000 may include sampling circuits and readout circuits that are electrically connected to the photoelectric conversion layer PD. For example, the wiring structure portion 2000 may include an inter-wiring insulating layer 2100 that covers the front side 1100*a* of the semiconductor substrate 1100, and wirings 2200 in the inter-wiring insulating layer 2100.

The light transmitting portion 3000 may be disposed on the back side 1100*b* of the semiconductor substrate 1100. The light transmitting portion 3000 may include a plurality of microlenses ML. The microlenses ML may be arranged to correspond to the respective unit pixels. For example, the microlenses ML may be arranged two-dimensionally (e.g., in a matrix form) when viewed in plan.

The microlenses ML may have a convex shape with a predetermined curvature radius. Accordingly, the microlenses ML may condense light incident on the photoelectric conversion layer PD. The microlenses ML may include, for example, a light transmitting resin, but is not limited thereto.

In some embodiments, the light transmitting portion 3000 may further include a surface insulating layer 3050 and color filters 3300. The surface insulating layer 3050 may be stacked on the back side 1100*b* of the semiconductor substrate 1100. The color filters 3300 may be disposed above the surface insulating layer 3050. The color filters 3300 may be arranged to correspond to the respective unit pixels In some embodiments, a grid pattern 3100 may be formed between the color filters 3300. The grid pattern 3100 may be formed on the surface insulating layer 3050. In some embodiments, the grid pattern 3100 may include a metal pattern 3110 and a low refractive index pattern 3120. For example, the metal pattern 3110 and the low refractive index pattern 3120 may be sequentially stacked on the surface insulating layer 3050.

In some embodiments, a first liner 3200 may be further formed on the surface insulating layer 3050 and the grid pattern 3100. The first liner 3200 may include, for example, aluminum oxide, but is not limited thereto.

In some embodiments, a second liner 3400 may be further formed on the microlenses ML. The second liner 3400 may extend along the surfaces of the microlenses ML. The second liner 3400 may include, for example, an inorganic oxide film (e.g., silicon oxide, titanium oxide, zirconium oxide, hafnium oxide, or a combination thereof), but is not limited thereto.

Referring to FIGS. 1 and 2, the transparent substrate 230 may be disposed above the top surface of the first semiconductor chip 200. The transparent substrate 230 may face the first semiconductor chip 200. In some embodiments, the transparent substrate 230 may face the microlenses ML of the first semiconductor chip 200. Light entering the semiconductor package according to some embodiments may pass through the transparent substrate 230 and reach the first semiconductor chip 200. The transparent substrate 230 may be, for example, a glass substrate or a plastic substrate, but is not limited thereto.

As illustrated in FIGS. 1 and 2, the transparent substrate 230 may have a width (as measured e.g., in a horizontal direction) smaller than the width of the first semiconductor chip 200. However, in other embodiments of the inventive concept the width of the transparent substrate 230 may be greater than or equal to the width of the first semiconductor chip 200.

The attachment dam 220 may be interposed between the first semiconductor chip 200 and the transparent substrate 230. The attachment dam 220 may fix the transparent substrate 230 on the top surface of the first semiconductor chip 200. The attachment dam 220 may include, for example, an epoxy resin composition including a filler, but is not limited thereto.

In some embodiments, the attachment dam 220 may define a gap 220A between the first semiconductor chip 200 and the transparent substrate 230. In some embodiments, the attachment dam 220 may extend along edges of the first semiconductor chip 200 to form a closed ring when viewed in plan. Accordingly, the transparent substrate 230 may be spaced apart from the first semiconductor chip 200 by a third distance D3 defined by the gap 220A. Here, the third distance D3 may range from about 100 μm to about 200 μm.

In some embodiments, the microlenses ML of the first semiconductor chip 200 may be arranged in the gap 220A. That is, the attachment dam 220 may surround an arrangement of microlenses ML.

Although FIG. 2 shows the attachment dam 220 having flat side surfaces, this need not always be the case, and other embodiments of the inventive concept may include an attachment da having other shapes. For example, depending on nature of the material(s) used to form the attachment dam 220 and/or the method(s) used to form the attachment dam 220, the side surfaces of the attachment dam 220 may have a concave or convex shape.

Further, although FIG. 2 shows the first chip pad 202 and the bonding wire 204 as being fully exposed by the attachment dam 220, this need not always be the case, and other embodiments of the inventive concept may cover (wholly or in part) the first chip pad 202 and/or the bonding wire 204.

The first molding layer 310 may be formed on the first surface 100a of the first package substrate 100 surrounding (wholly or in part) the first semiconductor chip 200, but laterally spaced apart from the first semiconductor chip 200. For example, the first molding layer 310 may extend fully around an outer edge of the first package substrate 100 to form a closed ring surrounding the first semiconductor chip 200. Accordingly, the attachment film 210, the first semiconductor chip 200, the attachment dam 220, and the transparent substrate 230 may be encompassed by the first molding layer 310.

Here, the first molding layer 310 may be formed to a first height H1 sufficiently high such that the first molding layer 310 effectively forms a dam structure on the first package substrate 100. For example, a top surface of the first molding layer 310 may rise to the first height H1 as measured from the first surface 100a of the first package substrate 100. Here, the first height H1 may range from about 0.2 mm to about 2 mm.

In some embodiments, the top surface of the first molding layer 310 may be formed lower than a top surface of the transparent substrate 230. Thus, in some embodiments, the first height H1 of the top surface of the first molding layer 310 may be lower than a second height H2 of the top surface of the transparent substrate 230. However, in other embodiments of the inventive concept, the first height H1 of the top surface of the first molding layer 310 may be greater than or equal to the second height H2 of the top surface of the transparent substrate 230.

The first molding layer 310 may include a first epoxy resin composition including, for example, an epoxy, a first curing agent, and a first filler.

The first curing agent may include, for example, at least one of a phenolic curing agent, a cationic curing agent, an acrylic curing agent, or an anhydride curing agent, but is not limited thereto.

The first filler may include at least one of silica ($SiO_2$) or alumina ($Al_2O_3$). In some embodiments, the first filler may further include at least one of fumed silica or fused silica.

In some embodiments, a content of the first filler may range from about 40% by mass to about 75% by mass of the first epoxy resin composition. In this regard, it has been determined that when the content of the first filler falls below about 40% by mass, the coefficient of thermal expansion (CTE) increases, thereby decreasing the overall reliability of the semiconductor package 10. However, it has also been determined that when the content of the first filler exceeds about 75% by mass, the viscosity and thixotropy of the first epoxy resin composition (material properties important to the proper formation of the first molding layer 310) become difficult to work with.

In some embodiments, the content of at least one of fumed silica or fused silica may range from about 3% by mass to about 20% by mass with respect to 100% by mass of the first epoxy resin composition.

With the first molding layer 310 in place, the second molding layer 320 may be formed on the first surface 100a of the first package substrate 100 to cover the first surface 100a of the first package substrate 100 and fill a space between the first semiconductor chip 200 and the first molding layer 310. Thus, the second molding layer 320 may be deposited within the dam structure formed by the first molding layer 310, and may surround and encompass the first semiconductor chip 200.

In some embodiments, the second molding layer 320 may cover the side surfaces of the attachment film 210, the first semiconductor chip 200, the attachment dam 220, and the transparent substrate 230. In some embodiments, the second molding layer 320 may expose a top surface of the transparent substrate 230. Accordingly, light incident to the semiconductor package 10a may pass through the transparent substrate 230 in order to reach the first semiconductor chip 200.

In some embodiments, the second molding layer 320 may encompass the bonding wire 204.

With this configuration, the second molding layer 320 will be spaced apart from the outer edge of the first package substrate 100 by a first distance D1 (i.e., a lateral width of the first molding layer 310). Thus, a side surface of the second molding layer 320 contacting a side surface of the first molding layer 310 may be spaced apart from the outer edge of the first package substrate 100 by the first distance D1. Here, the first distance D1 may range from about 1 mm to about 10 mm.

It follows that the first molding layer 310 will be spaced apart from the side surface of the transparent substrate 230 by a second distance D2 (i.e., a lateral width of the second molding layer 320). Thus, the side surface of the first molding layer 310 contacting the second molding layer 320 may be spaced apart from the side surface of the transparent substrate 230 by the second distance D2. Here, the second distance D2 may range from about 2 mm to about 50 mm.

In some embodiments, a top surface 320U of the second molding layer 320 may extend between the top surface of the transparent substrate 230 and a top surface 310U of the first molding layer 310. Thus, assuming that the first height H1 of the top surface of the first molding layer 310 is lower than the second height H2 of the top surface of the transparent substrate 230, the top surface of the second molding layer 320 will have a downward slope extending from the top surface of the transparent substrate 230 to the top surface 310U of the first molding layer 310.

In some embodiments, the top surface 320U of the second molding layer 320 may have a concave shape (or be concaved).

The second molding layer 320 may include a second epoxy resin composition different from the first epoxy resin composition. The second epoxy resin composition may include an epoxy, a second curing agent, and a second filler.

The second curing agent may include, for example, at least one of a phenolic curing agent, a cationic curing agent, an acrylic curing agent, or an anhydride curing agent, but is not limited thereto. The second curing agent may have the same material composition as the first curing agent, or may have a different material composition from the first curing agent.

The second filler may include at least one of silica ($SiO_2$) or alumina ($Al_2O_3$). In some embodiments, the second filler may further include at least one of fumed silica or fused silica. The second filler may have the same material composition as the first filler, or may have a different material composition from the first filler.

In some embodiments, the content of the second filler may range from about 50% by mass to about 85% by mass of the second epoxy resin composition. Here, it has been determined that when the content of the second filler falls below about 50% by mass, the coefficient of thermal expansion (CTE) increases, thereby decreasing the overall reliability of the semiconductor package 10. However, it has also been determined that when the content of the second filler exceeds about 85% by mass, the viscosity and thixotropy of the second epoxy resin composition decrease to the point where the second epoxy resin composition becomes difficult to work with.

In some embodiments, the content of at least one of fumed silica or fused silica ranges from about 3% by mass to about 20% by mass of the second epoxy resin composition (i.e., with respect to (or based on) 100% by mass of the second epoxy resin composition).

In some embodiments, the content of the second filler based on 100% by mass of the second epoxy resin composition may be less than the content of the first filler based on 100% by mass of the first epoxy resin composition. As an example, the content of the second filler based on 100% by mass of the second epoxy resin composition may range from about 50% by mass to about 60% by mass, and the content of the first filler based on 100% by mass of the first epoxy resin composition may range from about 60% by mass to about 80% by mass.

Accordingly, the first epoxy resin composition used to form the first molding layer 310 may have relatively high viscosity and high thixotropy, as compared with the second epoxy resin composition. In some embodiments, the viscosity of the first epoxy resin composition may range from about 80,000 cPs to about 200,000 cPs at room temperature. In some embodiments, a thixotropic index (TI) for the first epoxy resin composition may range from about 1.5 to about 4.5. (Here, the thixotropic index is a ratio of the viscosity of a target material at a shear rate of 0.5 rpm to the viscosity of the target material at a shear rate of 5.0 rpm).

In addition, the second epoxy resin composition used to form the second molding layer 320 may have a relatively low coefficient of thermal expansion (CTE) and a relatively high glass transition temperature (Tg), as compared with the first epoxy resin composition. In some embodiments, the second molding layer 320 may have a coefficient of thermal expansion ranging from about 10 ppm/° C. to about 20 ppm/° C. Preferably, the second molding layer 320 may have a coefficient of thermal expansion ranging from about 10 ppm/° C. to about 15 ppm/° C. In some embodiments, the glass transition temperature of the second molding layer 320 may range from about 100° C. to about 200° C.

As electronic products continue to be miniaturized, and yet expand in their functional capabilities, increasing demands for further miniaturization, multifunctionality, high integration density, low power consumption, ultra-high speed signal processing, high reliability and high productivity are placed upon semiconductor packages including image sensors. However, differences in the thermal expansion characteristics (as measured by corresponding coefficients of thermal expansion (CTE)) of different components within a semiconductor package may cause increased difficulties during fabrication of the semiconductor package. Such difficulties may decrease overall manufacturing yield and reliability. For example, a relatively high CTE for a molding layer covering (wholly or in part) an image sensor chip may cause defects (e.g., cracking) in the semiconductor package. In order to decrease the CTE of the molding layer, it is possible to reduce the content of the filler in the epoxy resin composition used to form the molding layer. However, this reduction in filler content decreases the viscosity and thixotropy of the epoxy resin composition, thereby making it difficult to form a molding layer having a desired height.

However, since the semiconductor package 10a includes both the first molding layer 310 and the second molding layer 320, it is possible to minimize CTE differences, while also being able to form molding layers having a desired height. That is, the material(s) forming the first molding layer 310 have relatively high viscosity and high thixotropy, sufficient to provide an adequate dam structure. Then, using this dam structure, the material(s) forming the second molding layer 320 may be readily deposited within the first molding layer 310 to form an inner molding layer having a predetermined height. Yet, the second molding layer 320—which is adjacent to the first semiconductor chip 200—may have a relatively low CTE, thereby reducing the risks associated with CTE differences between adjacent or proximate components within the semiconductor package 10. As a result, the semiconductor package 10a provides improved reliability.

Figure 4:
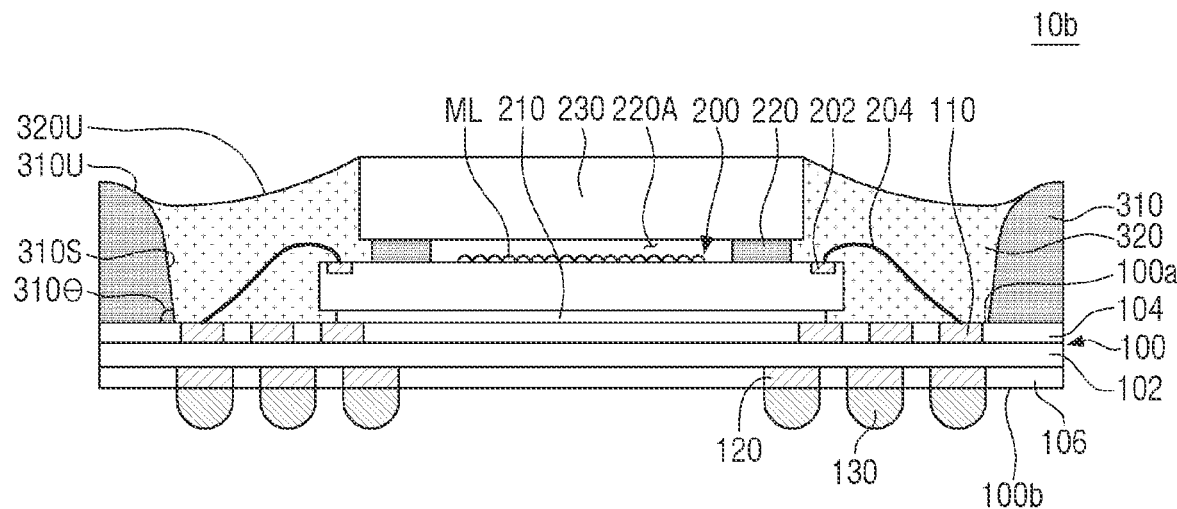
FIGS. 4 and 5 are cross-sectional diagrams variously illustrating semiconductor packages according to embodiments of the inventive concept.
Figure 5:
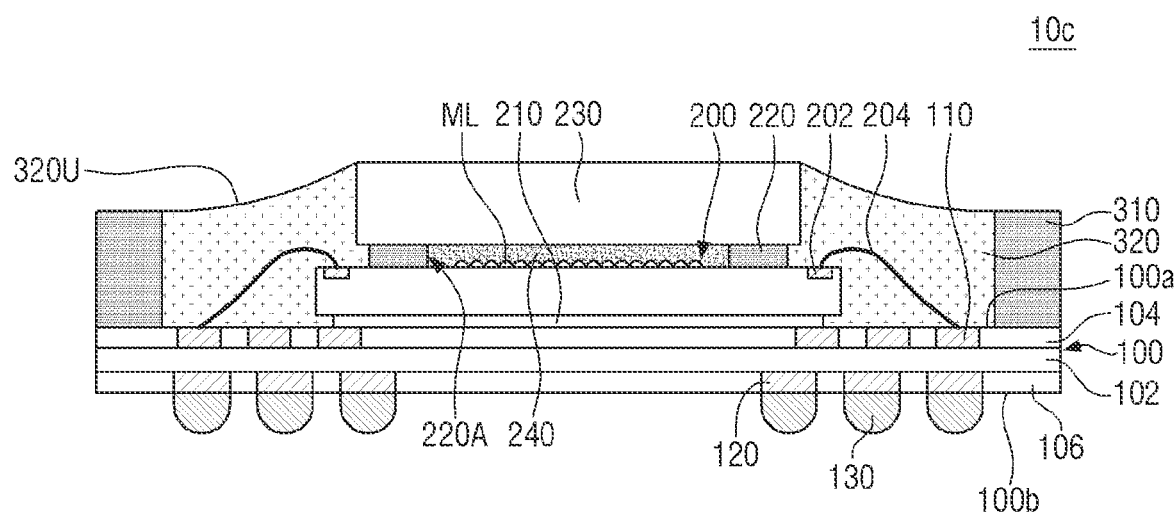

FIGS. 4 and 5 are respective cross-sectional views illustrating alternate versions (10b and 10c) of the semiconductor package 10a. The embodiments illustrated in FIGS. 4 and 5 are analogous to the embodiment illustrated in FIG. 2, and will be described principally in relation to differences with the embodiment illustrated in FIG. 2.

Referring to FIG. 4, the semiconductor package 10b includes the first molding layer 310 having a curved side surface 310S contacting the second molding layer 320. That is, relative to the first surface 100a of the first package substrate 100, the curved side surface 310S of the first molding layer 310 is formed with an acute angle 3100. In this case, the acute angle 3100 is an internal angle formed between the side surface 310S of the first molding layer 310 and the first surface 100a of the first package substrate 100. This particular structure may result when the first molding layer 310 is formed before the second molding layer 320 is formed.

In some embodiments consistent with the illustrated example of FIG. 4, the top surface 310U of the first molding layer 310 may be rounded or convex in shape. Accordingly, the concave top surface 320U of the second molding layer 320 may contact the convex top surface 310U of the first molding layer 310.

Referring to FIG. 5, the semiconductor package 10c may further include a gap fill layer 240.

The gap fill layer 240 may fill the gap 220A between the first semiconductor chip 200 and the transparent substrate 230. That is, the gap fill layer 240 may be interposed between the first semiconductor chip 200 and the transparent substrate 230. Further, the gap fill layer 240 may be formed inside of the attachment dam 220. In some embodiments, the gap fill layer 240 may cover (wholly or in part) the microlenses ML.

In some embodiments, the gap fill layer 240 may include a transparent resin material including at least one of poly (methyl methacrylate) (PMMA), polycarbonate (PC), a thermosetting transparent epoxy, or a transparent acrylonitrile butadiene styrene (ABS) resin, but is not limited thereto.

Figure 6:
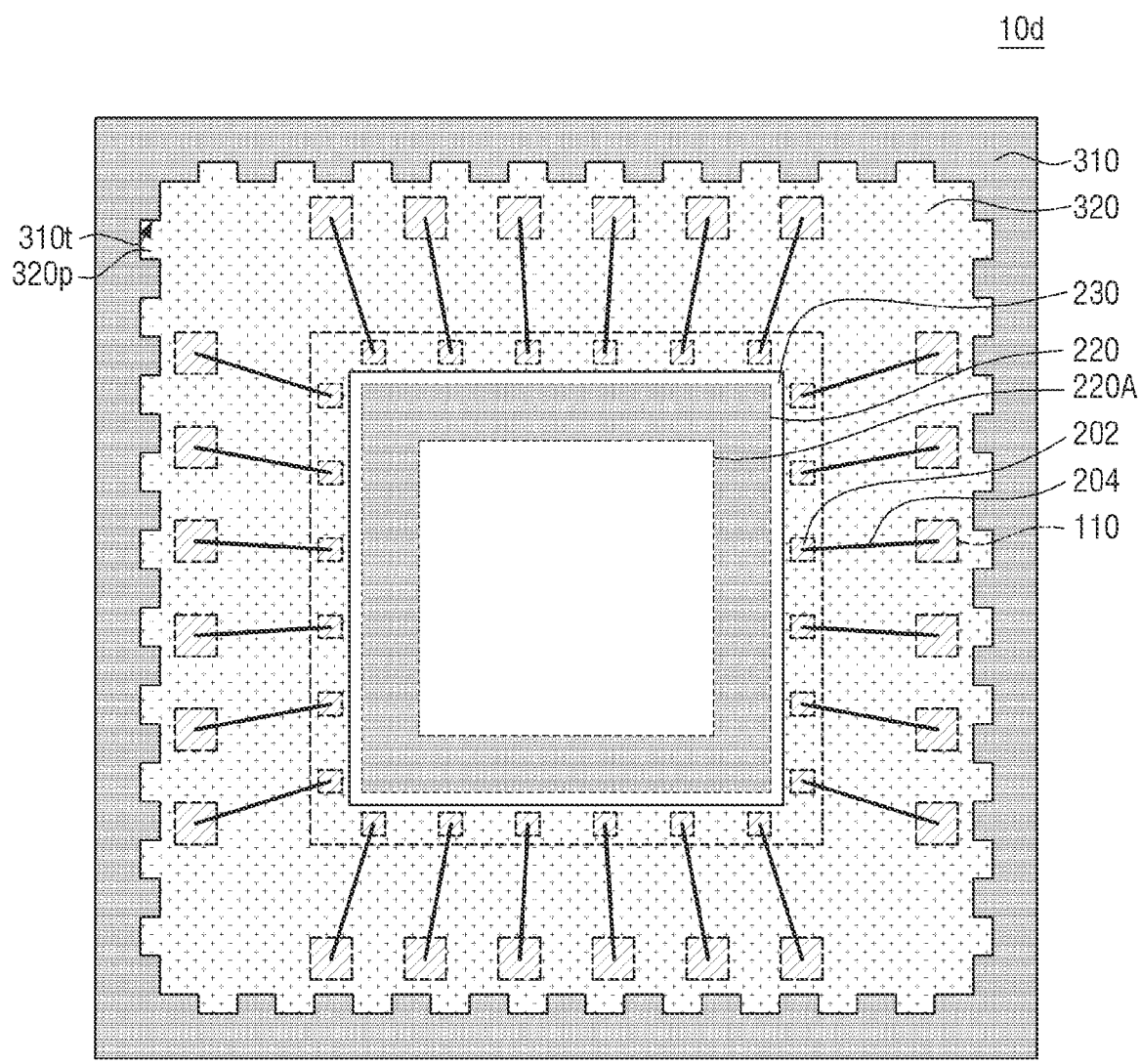
FIGS. 6 and 7 are plan diagrams variously illustrating semiconductor packages according to embodiments of the inventive concept.

FIG. 6 is another plan diagram illustrating a semiconductor package 10d according to embodiments of the inventive concept. The embodiment illustrated in FIG. 6 is analogous to the embodiment illustrated in FIG. 2, and will be described principally in relation to differences with the embodiment illustrated in FIG. 2.

Referring to FIG. 6, the semiconductor package 10d includes a patterned interface between the first molding layer 310 and the second molding layer 320.

For example, the interface between the first molding layer 310 and the second molding layer 320 may form an uneven structure. As an example, the first molding layer 310 may include inner edge recesses 310t, such that when the second molding layer 320 is formed within the first molding layer 310, the second molding layer 320 will include outward protrusions 320p respectively filling (wholly or part) the inner edge recesses 310t. The configuration increases a contact area between the inner edge of the first molding layer 310 and an outer edge of the second molding layer 320, further strengthening of the semiconductor package 10d.

Thus, the illustrated embodiment of FIG. 6 includes an interface between the first molding layer 310 and the second molding layer 320 having crenellated pattern that surrounds the transparent substrate 230. However, this is just only example of many different interfaces that may be shaped between the first molding layer 310 and the second molding layer 320. Depending on the arrangement and/or number of components (e.g., first substrate pad 110, first chip pad 202, bonding wire 204, first semiconductor chip 200, transparent substrate 230 and the like) and/or depending on the various CTEs of the components, the patterning of the interface between the first molding layer 310 and the second molding layer 320 may vary by shape.

Figure 7:
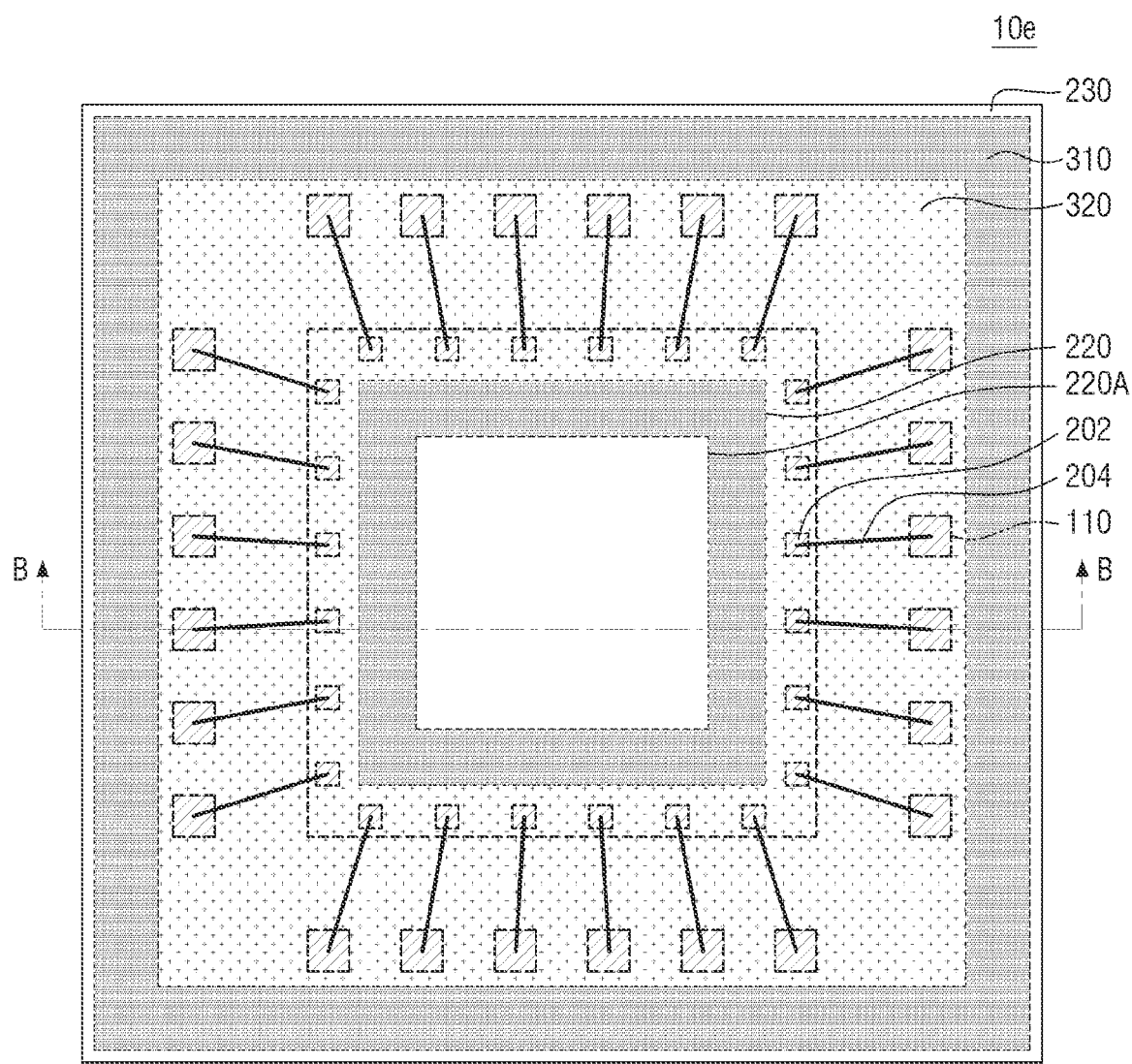
Figure 8:
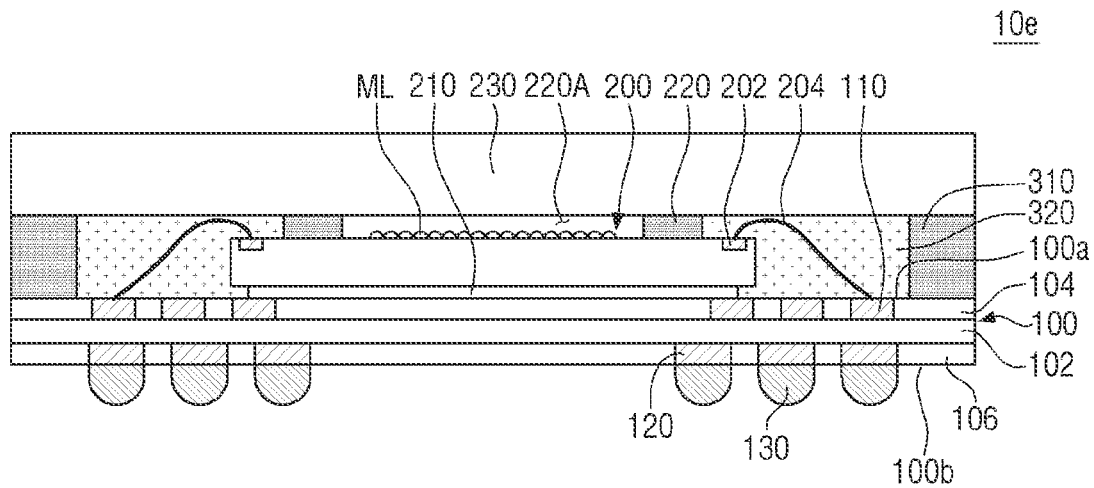
FIG. 8 is a cross-sectional diagram taken along line B-B of FIG. 7.

FIG. 7 is a plan diagram illustrating a semiconductor package 10e according to embodiments of the inventive concept, and FIG. 8 is a cross-sectional view taken along line B-B of FIG. 7.

Referring to FIGS. 7 and 8 in relation to the illustrated embodiment of FIGS. 1 and 2, the semiconductor package 10e may again include the transparent substrate 230, however the transparent substrate 230 has a size sufficient to cover the top surfaces of the first molding layer 310 and the second molding layer 320. For example, the transparent substrate 230 may extend along the top surface of the attachment dam 220 to cover both the top surface of the first molding layer 310 and the top surface of the second molding layer 320.

In some embodiments consistent with the illustrated embodiment of FIGS. 7 and 8, the top surface of the first molding layer 310 may have the same height as the top surface of the second molding layer 320 with respect to the first surface 100a of the first package substrate 100. In some embodiments, the top surfaces of the attachment dam 220, the first molding layer 310, and the second molding layer 320 may be disposed on the same horizontal plane.

In some embodiments, the side surface of the transparent substrate 230 may be disposed on the same vertical plane as the outer side surface of the first package substrate 100 and the outer side surface of the first molding layer 310.

Figure 9:
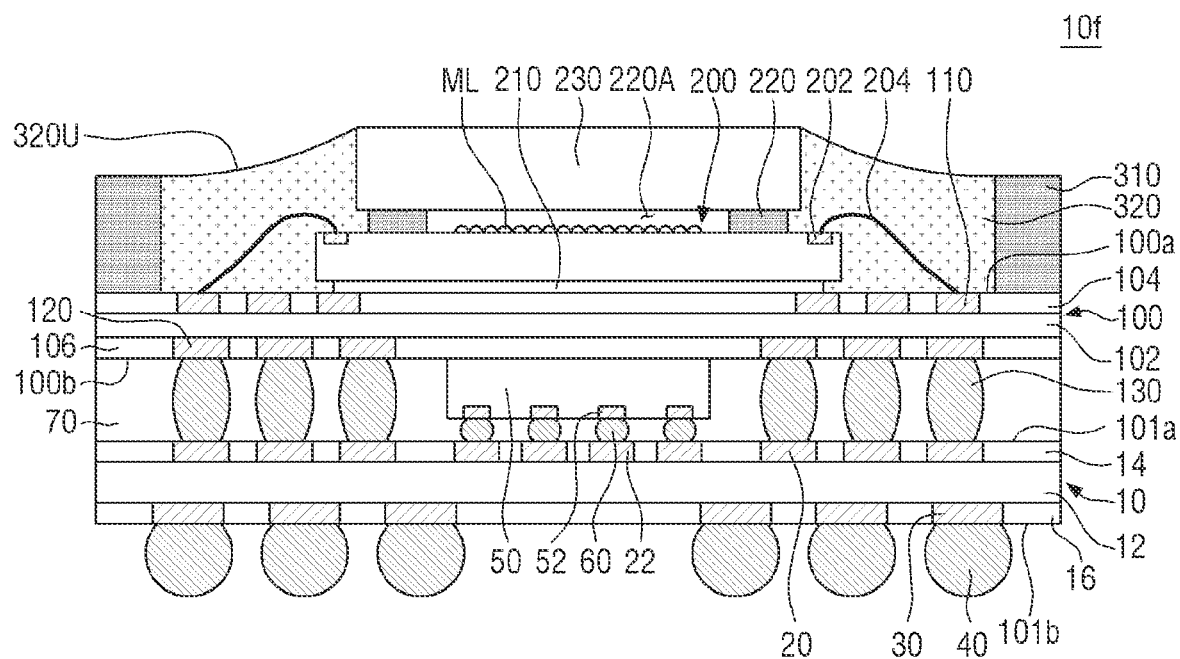
FIG. 9 is a cross-sectional diagram illustrating a semiconductor device according to embodiments of the inventive concept.

FIG. 9 is a cross-sectional diagram illustrating a semiconductor device 10f according to embodiments of the inventive concept.

Referring to FIG. 9, the semiconductor package 10f may further include a second package substrate 10, a second connection terminal 40, a second semiconductor chip 50, and a third molding layer 70.

The second package substrate 10 may serve as a substrate for a semiconductor package. As an example, the second package substrate 10 may be a printed circuit board (PCB). Alternatively, the second package substrate 10 may be a ceramic substrate, a wafer level package (WLP) substrate, or a package level package (PLP) substrate.

The second package substrate 10 may include a third surface 101a and an opposing fourth surface 101b. The third surface 101a of the second package substrate 10 may face the second surface 100b of the first package substrate 100. In some embodiments, the second package substrate 10 may include a second wiring layer 12, a third substrate pad 20, and a fourth substrate pad 30.

The third substrate pad 20 may be disposed on the top surface of the second wiring layer 12. The third substrate pad 20 may be exposed from the top surface of the second package substrate 10. For example, the third substrate pad 20 may be exposed by a third passivation layer 14 that covers the top surface of the second wiring layer 12. The third passivation layer 14 may be a solder resist layer, but is not limited thereto.

The fourth substrate pad 30 may be disposed on the bottom surface of the second wiring layer 12. The fourth substrate pad 30 may be exposed from the bottom surface of the second package substrate 10. For example, the fourth substrate pad 30 may be exposed by a fourth passivation layer 16 that covers the bottom surface of the second wiring layer 12. The fourth passivation layer 16 may be a solder resist layer, but is not limited thereto.

The second wiring layer 12 may include insulating layers made of plastic, ceramic or the like, and conductive vias and conductive wirings disposed in the insulating layers. The third substrate pad 20 may be electrically connected to the fourth substrate pad 30 by the conductive vias and the conductive wirings of the second wiring layer 12.

The second connection terminal 40 may be disposed on the fourth surface 101b of the second package substrate 10. The second connection terminal 40 may be electrically connected to the second package substrate 10. For example, the second connection terminal 40 may be attached to the fourth substrate pad 30 of the second package substrate 10. The second connection terminal 40 may be, for example, a solder ball, a bump, or the like. The second connection terminal 40 may electrically connect the semiconductor package according to some embodiments to an external electronic device or circuit.

In some embodiments, the first package substrate 100 may be electrically connected to the second package substrate 10. For example, the first connection terminal 130 may connect the third substrate pad 20 of the second package substrate 10 to the second substrate pad 120 of the first package substrate 100.

The second semiconductor chip 50 may be mounted on the third surface 101a of the second package substrate 10. The second semiconductor chip 50 may be electrically connected to the second package substrate 10. In some embodiments, a third connection terminal 60, which connects the second semiconductor chip 50 to the second package substrate 10, may be formed. As an example, the second semiconductor chip 50 may include a second chip pad 52 exposed from the bottom surface of the second second semiconductor chip 50. The third connection terminal 60 may connect the third substrate pad 20 of the second package substrate 10 to the second chip pad 52 of the second semiconductor chip 50. That is, the second semiconductor chip 50 may be mounted on the second package substrate 10 by a flip chip bonding method. The third connection terminal 60 may be, for example, a micro-bump, but is not limited thereto.

Although the second semiconductor chip 50 is shown as being electrically connected to the second package substrate 10 in FIG. 9 using a flip chip bonding method, this is only example. Alternately, the second semiconductor chip 50 may be electrically connected to the second package substrate 10 using bonding wire or bonding tape.

In some embodiments, the second semiconductor chip 50 may include at least one of a semiconductor memory chip, a digital signal processing integrated circuit, an application specific integrated circuit (ASIC), or a driver, but is not limited thereto.

The third molding layer 70 may be formed on the third surface 101a of the second package substrate 10 to fill a space between the first package substrate 100 and the second package substrate 10. For example, the third molding layer 70 may surround the side surfaces of the second semiconductor chip 50. The first connection terminal 130 may penetrate the third molding layer 70 to connect the first package substrate 100 to the second package substrate 10. The third connection terminal 60 may penetrate the third molding layer 70 to connect the second semiconductor chip 50 to the second package substrate 10. The third molding layer 70 may include, for example, an insulating polymer material such as an epoxy molding compound (EMC), but is not limited thereto.

Hereinafter, an exemplary method of fabricating a semiconductor package consistent with the embodiments previously described in relation to FIGS. 1 to 9 will be described in relation to FIGS. 1 to 18.

FIGS. 10 to 18 are related cross-sectional diagram illustrating in one example a method of fabricating a semiconductor package according to embodiments of the inventive concept.

Referring to FIG. 10, the attachment film 210 may be formed on the first package substrate 100.

The first package substrate 100 may be a substrate for a semiconductor package. As an example, the first package substrate 100 may be a printed circuit board (PCB). The first package substrate 100 may include the first surface 100a and the second surface 100b opposite to each other. In some embodiments, the first package substrate 100 may include the first wiring layer 102, the first substrate pad 110, and the second substrate pad 120.

The attachment film 210 may be formed on the first surface 100a of the first package substrate 100. The attachment film 210 may include, for example, a liquid epoxy, an adhesive tape, or a conductive medium, but is not limited thereto.

Referring to FIG. 11, multiple first semiconductor chips 200 may be attached on the attachment film 210.

The first semiconductor chips 200 may be attached to the attachment film 210 to be fixed on the first surface 100a of the first package substrate 100.

In some embodiments, each of the first semiconductor chips 200 may be an image sensor chip. For example, the first semiconductor chip 200 may include the plurality of microlenses ML.

Referring to FIG. 12, the bonding wire 204 may be formed to connect the first semiconductor chip 200 with the first package substrate 100.

As an example, the first semiconductor chip 200 may include a first chip pad 202 exposed from the top surface of the first semiconductor chip 200. The bonding wire 204 may connect the first chip pad 202 of the first semiconductor chip 200 to the first substrate pad 110 of the first package substrate 100. The bonding wire 204 may include, for example, metal such as gold (Au), but is not limited thereto.

Referring to FIG. 13, the attachment dam 220 may be formed on the first semiconductor chip 200.

In some embodiments, the attachment dam 220 may extend along the edge of the first semiconductor chip 200 to form a closed ring. That is, the attachment dam 220 may form a dam structure on the top surface of the first semiconductor chip 200. In some embodiments, the attachment dam 220 may surround the plurality of microlenses ML.

The attachment dam 220 may include, for example, an epoxy resin composition including a filler, but is not limited thereto.

Figure 14:
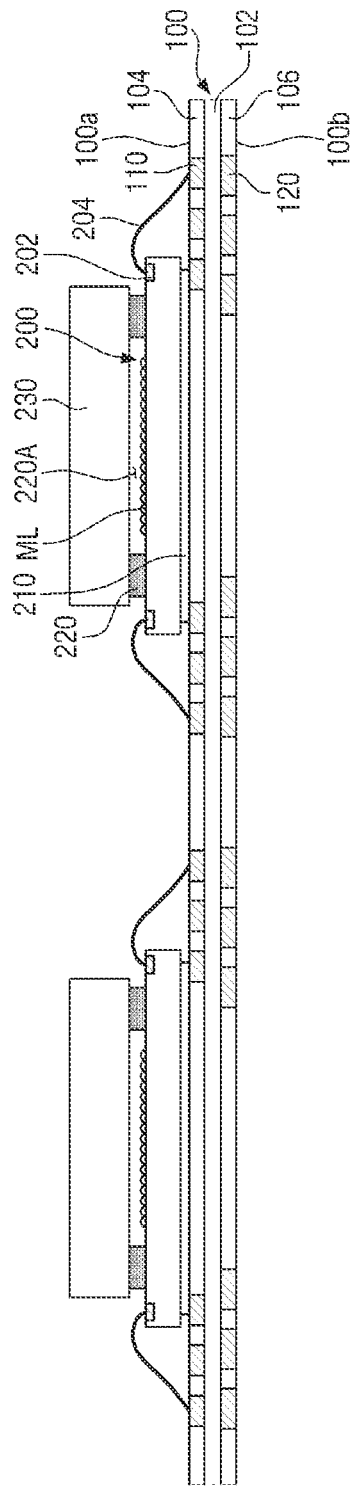

Referring to FIG. 14, the transparent substrate 230 may be attached on the attachment dam 220.

The transparent substrate 230 may face the first semiconductor chip 200. Accordingly, the gap 220A may be defined between the first semiconductor chip 200 and the transparent substrate 230. In some embodiments, the transparent substrate 230 may face the microlenses ML of the first semiconductor chip 200. That is, the plurality of microlenses ML of the first semiconductor chip 200 may be arranged in the gap 220A. The transparent substrate 230 may be, for example, a glass substrate or a plastic substrate, but is not limited thereto.

Figure 15:
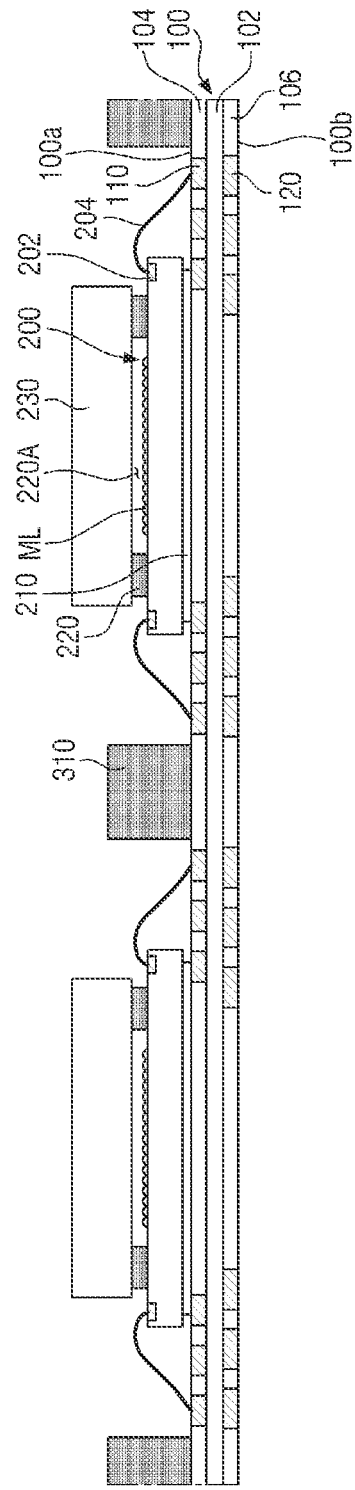

Referring to FIG. 15, the first molding layer 310 may be formed on the first surface 100a of the first package substrate 100 between adjacent ones of the plurality of semiconductor chips 200.

Thus, the first molding layer 310 may surround the first semiconductor chip 200 while being spaced apart from the first semiconductor chip 200. For example, the first molding layer 310 may extend along the edge of the first package substrate 100 to form a closed ring. The first molding layer 310 may be formed at a predetermined height so that it may properly function as a dam structure disposed on the first package substrate 100.

The first molding layer 310 may include a first epoxy resin composition, where the first epoxy resin composition may include an epoxy, a first curing agent, and a first filler. In some embodiments, the content of the first filler may range from about 40% by mass to about 75% by mass with respect to the first epoxy resin composition.

Figure 16:
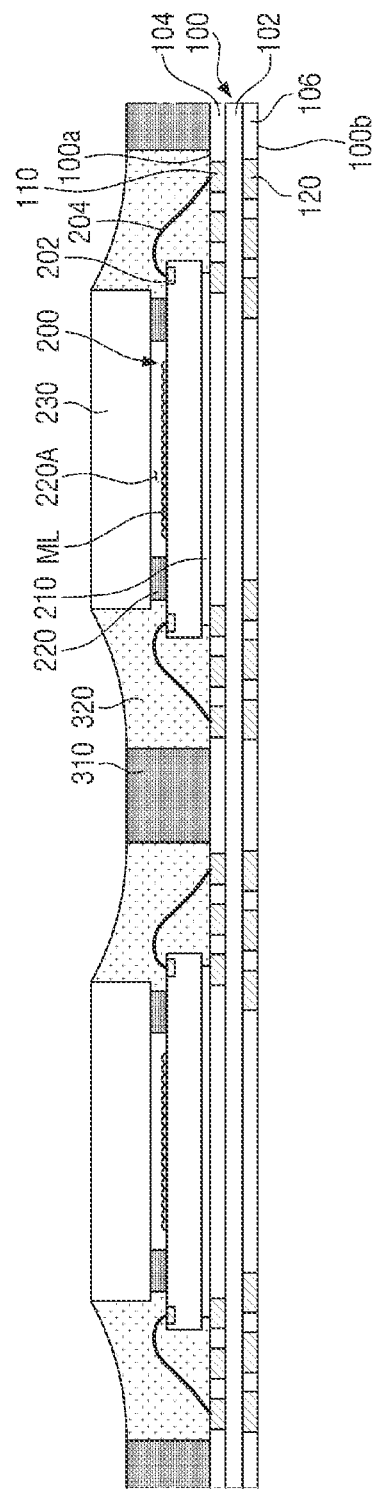

Referring to FIG. 16, the second molding layer 320 may be formed on the first surface 100a of the first package substrate 100 to fill a space between the first semiconductor chip 200 and the first molding layer 310. For example, the second molding layer 320 may be disposed within the first molding layer 310 (i.e., the dam structure), and may surround the side surface of the first semiconductor chip 200. In some embodiments, the second molding layer 320 may cover the side surfaces of the attachment film 210, the first semiconductor chip 200, the attachment dam 220, and the transparent substrate 230. In some embodiments, the second molding layer 320 may expose the top surface of the transparent substrate 230. In some embodiments, the second molding layer 320 may cover the bonding wire 204.

The second molding layer 320 may include a second epoxy resin composition different from the first epoxy resin composition. The second epoxy resin composition may include an epoxy, a second curing agent, and a second filler. In some embodiments, the content of the second filler may range from about 50% by mass to about 85% by mass of the second epoxy resin composition.

In some embodiments, the content of the second filler, based on the mass of the second epoxy resin composition, may be smaller than the content of the first filler, based on the mass of the first epoxy resin composition.

Accordingly, the first epoxy resin composition forming the first molding layer 310 may have relatively high viscosity and high thixotropy. In some embodiments, the viscosity of the first epoxy resin composition may range from about 80,000 cPs to about 200,000 cPs at room temperature. In some embodiments, a thixotropic index (TI) of the first epoxy resin composition may range from about 1.5 to about 4.5.

In addition, the second epoxy resin composition forming the second molding layer 320 may have a relatively low CTE and a relatively high glass transition temperature (Tg). In some embodiments, the second molding layer 320 may have a CTE ranging from about 10 ppm/° C. to about 20 ppm/° C. Preferably, the second molding layer 320 may have a CTE ranging from about 10 ppm/° C. to about 15 ppm/° C. In some embodiments, the glass transition temperature of the second molding layer 320 may range from about 100° C. to about 200° C.

Figure 17:
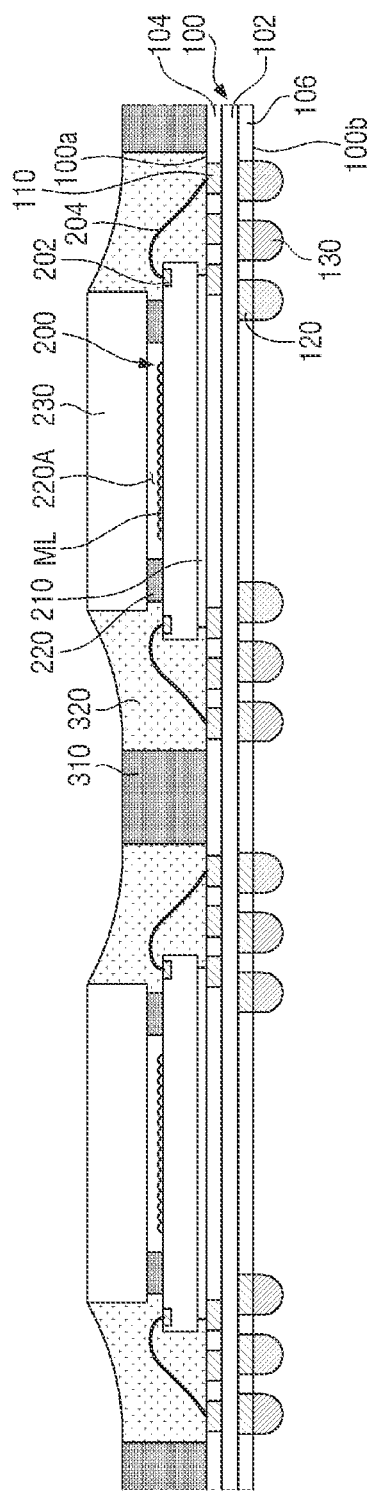

Referring to FIG. 17, the first connection terminal 130 may be formed on the second surface 100b of the first package substrate 100.

The first connection terminal 130 may be electrically connected to the first package substrate 100. For example, the first connection terminal 130 may be attached to the second substrate pad 120 of the first package substrate 100. The first connection terminal 130 may be, for example, a solder ball, a bump, or the like. The first connection terminal 130 may include metal such as tin (Sn), but is not limited thereto.

Figure 18:
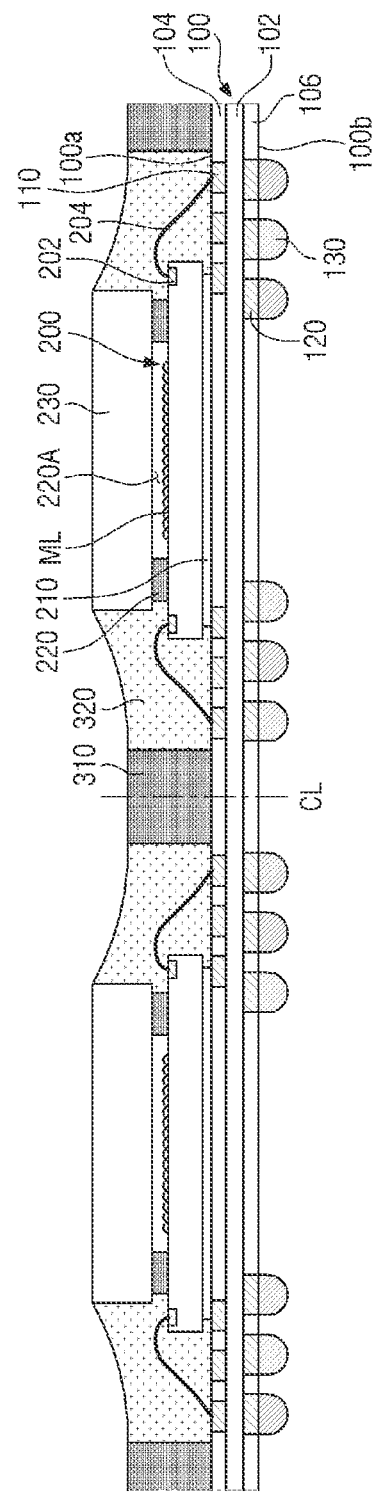

Referring to FIG. 18, a dicing process may now be is performed.

For example, the first package substrate 100 may be cut along a cutting line CL between adjacent ones of the first semiconductor chips 200. That is, as shown in FIGS. 1, 2 and 3, singulated semiconductor packages—each including the first semiconductor chip 200—may be formed.

In some embodiments, the cutting line CL may vertically traverse the first molding layer 310. That is, the dicing process may be performed by cutting the first molding layer 310 and the first package substrate 100.

Certain embodiments of the inventive concept have been presented to teach the making and use of various semiconductor packages according to the inventive concept. However, the inventive concept is not limited to only the illustrated embodiments, but covers many modifications and extensions drawn from the illustrated embodiments, as set forth in the following claims.

What is claimed is:

1. A semiconductor package comprising:
a package substrate;
a semiconductor chip mounted on the package substrate;
a transparent substrate disposed on the semiconductor chip;
an attachment dam between the semiconductor chip and the transparent substrate, the attachment dam extending along an edge of the semiconductor chip to define a gap between the semiconductor chip and the transparent substrate;
a first molding layer on the package substrate, the first molding layer surrounding a side surface of the semiconductor chip and including a first epoxy resin composition; and
a second molding layer on the package substrate, the second molding layer filling a space between the semiconductor chip and the first molding layer and including a second epoxy resin composition,
wherein the first epoxy resin composition includes a first filler containing at least one of silica or alumina,
the second epoxy resin composition includes a second filler containing at least one of silica or alumina,
a content of the second filler with respect to the second epoxy resin composition is greater than a content of the first filler with respect to the first epoxy resin composition, and
the transparent substrate covers top surfaces of the semiconductor chip, the first molding layer and the second molding layer.

2. The semiconductor package of claim 1, wherein the content of the first filler with respect to 100% by mass of the first epoxy resin composition is 40% by mass to 75% by mass, and
the content of the second filler with respect to 100% by mass of the second epoxy resin composition is 50% by mass to 85% by mass.

3. The semiconductor package of claim 1, wherein each of the first epoxy resin composition and the second epoxy resin composition further includes a curing agent, and
the curing agent includes at least one of a phenolic curing agent, a cationic curing agent, an acrylic curing agent, or an anhydride curing agent.

4. The semiconductor package of claim 1, wherein a thixotropic index (TI) of the first epoxy resin composition is greater than a thixotropic index of the second epoxy resin composition, and
a coefficient of thermal expansion (CTE) of the second molding layer is smaller than a coefficient of thermal expansion of the first molding layer.

5. The semiconductor package of claim 1, wherein the semiconductor chip is an image sensor chip.

6. A semiconductor package comprising:
a first package substrate including a first surface and a second surface opposite to each other;
an image sensor chip mounted on the first surface of the first package substrate;
a transparent substrate disposed on the image sensor chip;
an attachment dam between the image sensor chip and the transparent substrate, the attachment dam extending along an edge of the image sensor chip to define a gap between the image sensor chip and the transparent substrate;
a first molding layer on the first surface of the first package substrate, the first molding layer being spaced apart from the image sensor chip and surrounding a side surface of the image sensor chip; and
a second molding layer on the first surface of the first package substrate, the second molding layer filling a space between the image sensor chip and the first molding layer,
wherein a side surface of the first molding layer facing the second molding layer forms an acute angle with the first surface of the first package substrate, and
the side surface of the first molding layer including a plurality of inner edge recesses, and a side surface of the second molding layer including a plurality of protrusions that respectively extend into the plurality of inner edge recesses.

7. The semiconductor package of claim 6, wherein the image sensor chip includes a plurality of microlenses arranged in the gap.

8. The semiconductor package of claim 6, further comprising a bonding wire electrically connecting the first package substrate to the image sensor chip,
wherein the second molding layer covers the bonding wire.

9. The semiconductor package of claim 6, wherein with respect to the first surface of the first package substrate, a height of a top surface of the first molding layer is lower than that of a top surface of the transparent substrate.

10. The semiconductor package of claim 6, wherein a top surface of the first molding layer is convex.

11. The semiconductor package of claim 6, wherein a top surface of the second molding layer connects a top surface of the transparent substrate to a top surface of the first molding layer.

12. The semiconductor package of claim 11, wherein the top surface of the second molding layer is concave.

13. The semiconductor package of claim 6, wherein the first molding layer includes a first epoxy resin composition including a first filler containing at least one of silica or alumina,
the second molding layer includes a second epoxy resin composition including a second filler containing at least one of silica or alumina, and
a content of the second filler with respect to the second epoxy resin composition is greater than a content of the first filler with respect to the first epoxy resin composition.

14. A semiconductor package comprising:
a package substrate;
a semiconductor chip mounted on the package substrate;
a transparent substrate disposed on the semiconductor chip;
an attachment dam between the semiconductor chip and the transparent substrate, the attachment dam extending along an edge of the semiconductor chip to define a gap between the semiconductor chip and the transparent substrate;
a first molding layer on the package substrate, the first molding layer surrounding a side surface of the semiconductor chip; and
a second molding layer on the package substrate, the second molding layer filling a space between the semiconductor chip and the first molding layer,
wherein a coefficient of thermal expansion (CTE) of the second molding layer is smaller than that of the first molding layer, and
wherein the first molding layer includes a first epoxy resin composition having a first thixotropic index, the second molding layer includes a second epoxy resin composition having a second thixotropic index, and the first thixotropic index is greater than the second thixotropic index.

15. The semiconductor package of claim 14, wherein the coefficient of thermal expansion of the second molding layer ranges from 10 ppm/° C. to 20 ppm/° C.

16. The semiconductor package of claim 14, wherein the first epoxy resin composition includes a first filler containing at least one of silica or alumina,
the second epoxy resin composition includes a second filler containing at least one of silica or alumina, and
a content of the second filler with respect to the second epoxy resin composition is greater than a content of the first filler with respect to the first epoxy resin composition.

17. The semiconductor package of claim 16, wherein the first thixotropic index of the first epoxy resin composition is 1.5 to 4.5.

18. The semiconductor package of claim 16, wherein a viscosity of the first epoxy resin composition is greater than that of the second epoxy resin composition.

19. The semiconductor package of claim 16, wherein a glass transition temperature (Tg) of the second molding layer is 100° C. to 200° C.

\* \* \* \* \*